United States Patent [19]

Phillips et al.

[11] Patent Number: 4,901,026

[45] Date of Patent: Feb. 13, 1990

[54] PHASE DETECTOR CIRCUIT HAVING LATCHED OUTPUT CHARACTERISTIC

[75] Inventors: Donald E. Phillips, Cedar Rapids; Gregory A. Jobe, Marion, both of Iowa

[73] Assignee: Rockwell International Corporation, El Segundo, Calif.

[21] Appl. No.: 275,803

[22] Filed: Nov. 23, 1988

Related U.S. Application Data

[62] Division of Ser. No. 68,877, Jul. 1, 1987, Pat. No. 4,801,896.

[51] Int. Cl.$^4$ ............................ H03L 7/08; H03K 9/08
[52] U.S. Cl. .................................... 328/133; 328/110; 331/25; 307/514
[58] Field of Search ............... 328/133, 134, 109, 110, 328/155; 307/514, 516; 331/1 R, 1 A, 25

[56] References Cited

U.S. PATENT DOCUMENTS

| | | | |
|---|---|---|---|
| 3,431,509 | 3/1969 | Andrea | 331/25 |
| 3,953,794 | 4/1976 | Moore | 328/133 |
| 4,277,754 | 7/1981 | Minakuchi | 328/133 |
| 4,291,274 | 9/1981 | Suzuki et al. | 328/133 |
| 4,322,643 | 3/1982 | Preslar | 328/133 |
| 4,339,731 | 7/1982 | Adams | 331/1 A |
| 4,500,852 | 2/1985 | Phillip | 331/12 |
| 4,502,014 | 2/1985 | Bismarck | 328/110 |
| 4,633,487 | 12/1986 | Goeb et al. | 328/134 |
| 4,751,469 | 6/1988 | Nakagawa et al. | 328/110 |
| 4,764,737 | 8/1988 | Kaatz | 328/134 |
| 4,801,896 | 1/1989 | Phillips et al. | 331/1 R |

FOREIGN PATENT DOCUMENTS 54-117666  9/1979  Japan.
60-224322 11/1985  Japan.

OTHER PUBLICATIONS

Motorola MC 4344/ML4044 Data Sheet A11.

Primary Examiner—Stanley D. Miller
Assistant Examiner—Timothy P. Callahan
Attorney, Agent, or Firm—M. Lee Murrah; V. Lawrence Sewell; H. Fredrick Hamann

[57] ABSTRACT

A phase detector circuit for providing an output indicative of the phase relationship between two input signals. The output of the phase detector responds rapidly to changes in the phase relationship between the input signals and avoids "cycling" when this phase relationship is less than $-2\pi$ or greater than $2\pi$. The phase detector includes circuit means for detecting when the phase relationship is outside a desired range such as proportional phase detectors which operate in combination with a differential type phase detector for providing the required output.

7 Claims, 2 Drawing Sheets

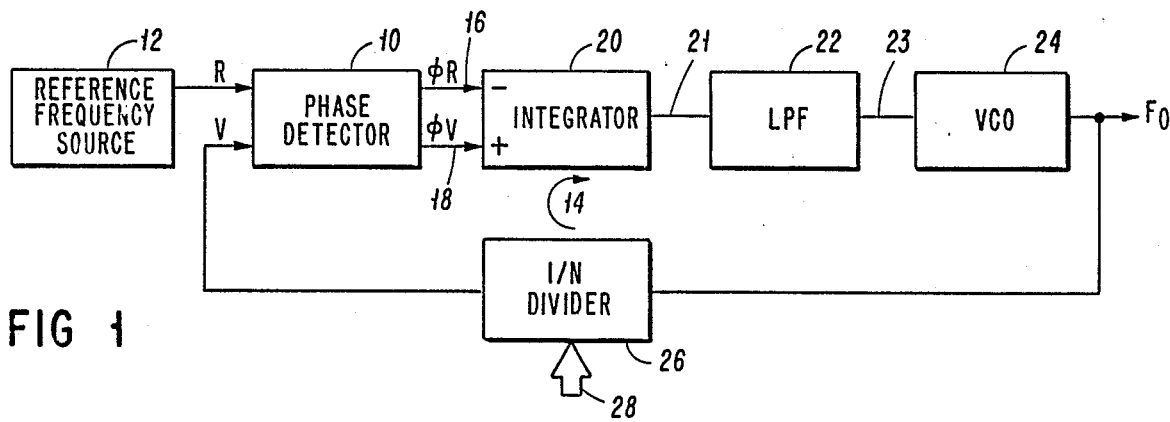
FIG 1
FIG 3a
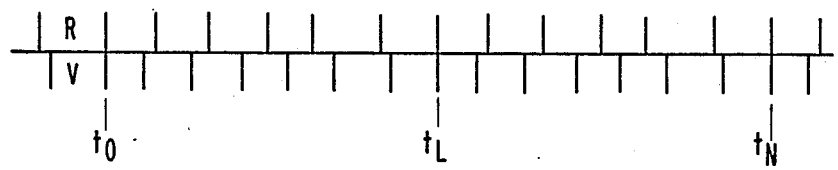
FIG 3b
FIG 3c
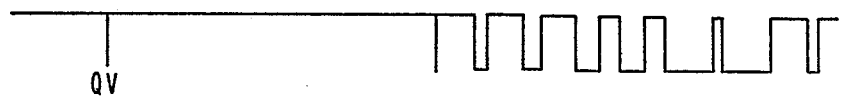
FIG 4a  PRIOR ART
ERROR VOLTAGE
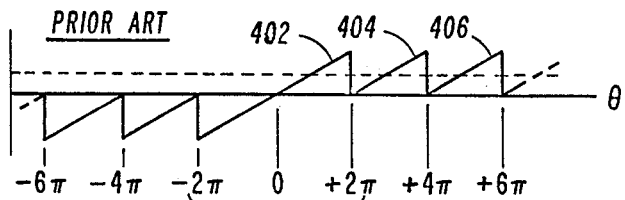
FIG 4b
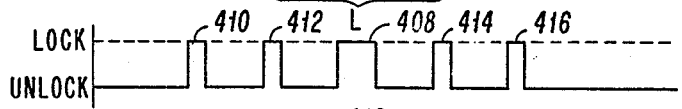
FIG 4c  INVENTION
ERROR VOLTAGE
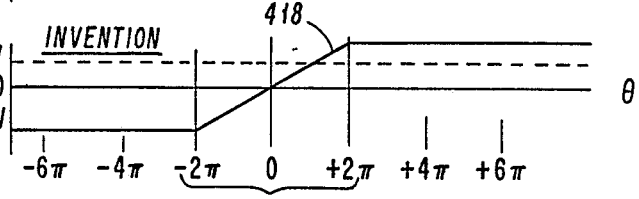
FIG 4d
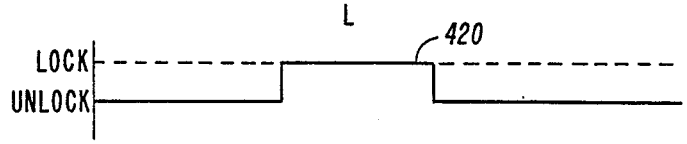

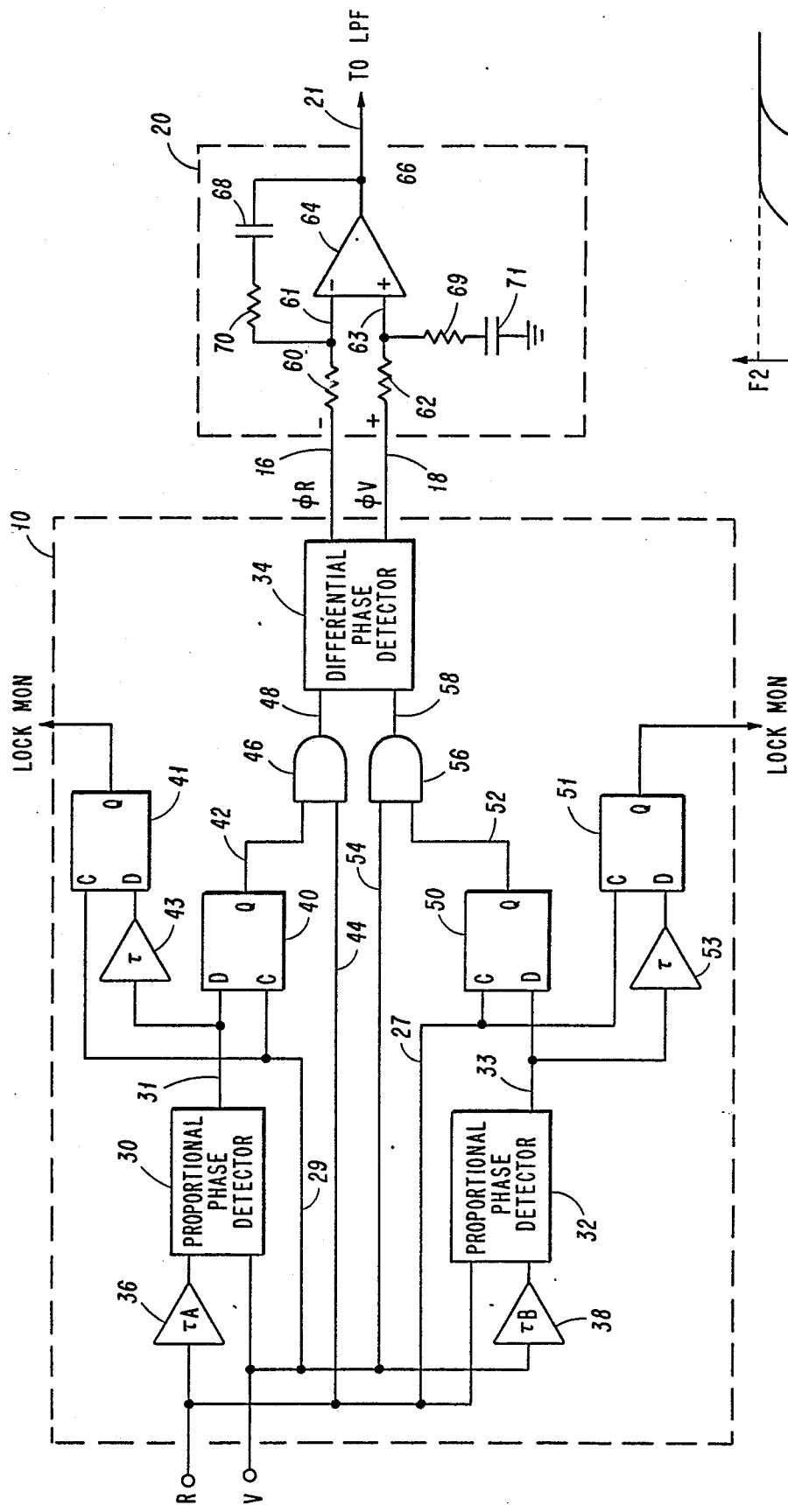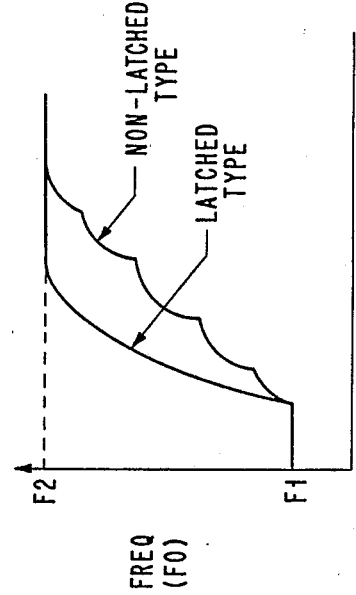
FIG 5
FIG 2

PHASE DETECTOR CIRCUIT HAVING LATCHED OUTPUT CHARACTERISTIC

This application is a divisional of application Ser. No. 068,877 filed on July 1, 1987, now U.S. Pat. No. 4,801,896.

BACKGROUND OF THE INVENTION

The invention relates to radio frequency tuners, and more particularly to such tuners which employ phase-locked-loops as frequency generation elements, and most particularly to phase detectors used in such phase-locked loop radio frequency tuners.

Phase-locked-loops are commonly used in circuits to produce a precise, stable frequency. They can be used both as an oscillator in a receiver to detect signals of prescribed frequency and as a frequency synthesizer in a transmitter to generate an output signal having a selectively variable frequency. The basic elements of a phase-locked-loop (PLL) include a voltage controlled oscillator (VCO) for producing an output signal having a controlled frequency, a detector for comparing the phase of the output signal with that of a predetermined reference signal and for producing an error signal representing the detected phase difference, and a loop filter for filtering the error signal and coupling it to the VCO to controllably adjust the output signal's frequency.

A common use of PLL frequency synthesizers is in frequency hopping radio communications systems which are used for secure communications. These systems use radio transmitters and receivers which hop in synchronization from one frequency to another in a predetermined sequence, transmitting and receiving a small part of a message on each frequency. The security of the frequency hopping technique depends both upon the choice of frequencies and upon the hopping rate. Increasing the hopping rate increases the difficulty of unauthorized monitoring stations in determining the hopping patterns and following the hopping sequence.

The frequency hopping rate is limited primarily by the time required for PLL's to change from one frequency to another. The frequency change rate is affected by a number of factors. For example, the bandwidth of the PLL loop filter significantly limits the frequency change rate. More relevant to the present invention, however, are the limitations due to the phase detector.

Prior art phase detectors of the differential type are subject to "cycling" outside the desired phase lock range as the phase relationship between the reference signal and the VCO output signal changes. This results in an error signal which varies with phase angle, and over several $2\pi$ phase ranges exhibits a triangular, "sawtooth" waveform. It is the average level of this signal which is used to urge the VCO toward the desired lock-in range. With the triangular waveforms of prior art detectors, this voltage, and the resulting slew rate, is only 50 per cent of theoretical due to cycling. The VCO output frequency thus changes more slowly than if the peak signal level were used.

Prior art phase detectors are also subject to an ambiguity since it is not possible to determine from the cycling phase detector error signal whether the PLL is within or without the desired lock-in range and thus a momentary false lock-in indication is given. Consequently, there is no positive indication of lock-in, and a transmitter cannot be limited to operation only while positively locked onto the selected frequency.

It is therefore an object of the present invention to provide an improved PLL.

It is another object of the present invention to provide a PLL which locks onto the desired frequency more quickly.

It is a further object of the present invention to provide a PLL which permits operation of a radio transmitter only when the PLL is locked onto the desired frequency.

It is an additional object of the present invention to provide a PLL which provides a smoother change from one frequency to another.

It is still another object of the present invention to provide an improved phase detector for use in PLL's.

It is still a further object of the present invention to provide a phase detector which provides a higher level error signal for control of a VCO, outside the desired lock-in range.

It is an additional object of the present invention to provide a phase detector which provides a positive lock-in indication.

SUMMARY OF THE INVENTION

With these and other objects in view, a phase detector circuit operative in response to first and second input signals includes means to generate a signal indicative of the phase relationship between the first and second input signals and means for decoupling first and second input signals from the generating means when a detecting means identifies a phase relationship between the first and second signals which is outside a predetermined range.

BRIEF DESCRIPTION OF THE DRAWINGS

The invention may be more fully understood by reading the following description of a preferred embodiment thereof in conjunction with the appended drawings, wherein:

FIG. 1 is a block diagram of a phase locked loop circuit employing the present invention., FIG. 2 is a block diagram of a phase detector in accordance with the present invention;

FIG. 3 (a,b,c) is a series of timing diagrams illustrating aspects of the operation of the phase detector of FIG. 2;

FIG. 4 (a,b,c,d) is a series of graphs comparing the error voltage produced by phase detectors of the prior art and by that of the present invention as a function of phase angle $\theta$; and FIG. 5 is a graph comparing the frequency change of the latched phase detector of the present invention to the non-latched phase detectors of the prior art.

DESCRIPTION OF A PREFERRED EMBODIMENT

Referring to FIG. 1, a phase locked loop (PLL) circuit in which the present invention may be used is shown. The phase detector 10 of the present invention is fed a clock signal R from a reference frequency source 12 and a variable signal V from feedback loop 14. Phase detector 10 provides differential output signals $Q_R$ at line 16 and $Q_V$ at line 18, the state of $Q_R$ and $Q_V$ being representative of the phase difference between signals R and V. The difference between $Q_R$ and $Q_V$ is integrated by integrator 20 to produce a DC signal representative of the phase difference between signals R and V.

The integrator output is passed through a low pass filter 22 to remove high frequency components, and the resultant voltage is fed to a voltage controlled oscillator 24 which produces an output signal $F_O$.

A portion of signal $F_O$ is fed back to a 1/N divider 26 which in conjunction with an input device represented by arrow 28 comprises a tuning apparatus. The output from divider 26 is fed to phase detector 10 as signal V. L Thus, as the divide ratio of 1/N divider 26 is changed by input device 28, phase detector 10 and integrator 20 together produce an error voltage at the input 23 of VCO 24 which is representative of the phase difference between reference signal R and variable signal V. The error voltage changes the output frequency of VCO 24, and this process continues until signals R and V are in phase and the PLL is thus "locked in." When the loop is tuned to a new frequency by input device 28, and the divider ratio of divider 26 is changed, signals R ∂ V are forced out of phase, and the VCO frequency is again changed until a new locked condition is attained.

Referring now to FIG. 2, a block diagram of phase detector 10 and integrator 20 of FIG. 1 are shown. Essentially, phase detector 10 comprises $2\pi$ proportional phase, or "type-1", detectors 30 and 32 which slave a differential, or "type-2", phase detector 34 as hereinafter described. Proportional phase detectors 30 and 32 are well known in the art, and their detailed construction and operation will not be repeated here. A description of this type of phase detector is found in U.S. Pat. Nos. 3,431,509 to Andrea and 4,500,852 to Phillips, which are incorporated herein by reference. Likewise, differential phase detector 34 is well-known in the art and is described in application notes for phase frequency detector devices MC4344 and MC4044 by Motorola Semiconductor Products, Inc., Box 20912, Phoenix, AZ. 85036, which is incorporated herein by reference.

Normally differential phase detector 34 operates as illustrated in FIG. 3. Referring to FIG. 3(a), a series of pulses representing reference signal R and variable signal V are shown having a time varying phase relationship. Pulses V are shown as negative-going while pulses R are shown as positive-going, but it should be understood that the relative polarities are unimportant and may be taken into account using well-known standard circuit design techniques. Further, although signals R and V may actually be square waves in their original form, the use of edge-triggered devices in the circuitry effectively convert them to the pulse form as illustrated. It should be noted that the pulse spacing of signal R is not equal to the pulse spacing of signal V, to represent a frequency difference. Immediately after time $t_O$, the V pulses lead the R pulses by increasing amounts, until the phase difference disappears and they are in phase at time $t_L$, and again at time $t_N$ after another whole cycle has slipped.

The outputs $Q_R$ and $Q_V$ of differential phase detector 10 are shown in FIG. 3(b) and 3(c), respectively. Waveforms $Q_R$ and $Q_V$ comprise a series of rectangular waveforms whose width is proportional to the phase difference between signals R and V. As is characteristic of this type of phase detector, the $Q_R$ output provides a signal when the R pulse is leading the V pulse, and the $Q_V$ output provides a signal when the V pulse is leading the R pulse.

If the pulse streams R and V in FIG. 3(a) were to be continued prior to $t_O$, the $Q_R$ output pattern would be repeated the same as between $t_O$ and $t_L$. Similarly, if the pulse streams R and V were to be continued after $t_N$, the $Q_V$ output pattern would be repeated the same as between $t_L$ and $t_N$.

When signals $Q_R$ and $Q_V$ are integrated by integrator 20 and filtered by LPF 22, the average voltage at point 23 varies as shown in FIG. 4(a) as the phase of R and V is varied over several complete cycles. Note that the integrator generates the integral of the difference between $Q_R$ and $Q_V$ as indicated by the polarity symbols at the input of integrator 20. Note that the waveform repeats itself before $-2\pi$ and after $+\pi$. Thus, the differential phase detector does not provide a stable lock indicator signal within the range L which is defined as $-2\pi < \theta < 2\theta$. If the output voltage is a level $+V_1$, for example, it is not possible to know whether the phase relationship is a point 402, 404, or 406, for example. Thus, for any voltage level it is impossible to determine whether the PLL is in the lock range L or whether it is outside the range L and is merely "cycling." The ambiguity reflects itself in the lock monitor signal shown in FIG. 4(b). In addition to the correct lock signal at 408, erroneous lock monitor signals are also provided at 410, 412, 414, and 416.

Returning now to FIG. 2 the purpose of proportional phase detectors 30 and 32 is to detect when the phase relationship between signals R and V is outside the $4\pi$ lock range L [see FIG. 4(a)] and to prevent R and V pulses from entering differential phase detector 34 if that phase relationship exists. In effect differential phase detector 34 is slaved to proportional phase detectors 30 and 32. More particularly, reference signal R and variable signal V as previously described are both simultaneously fed to proportional phase detectors 30 and 32. Signal R is delayed in the input to phase detector 30 by an amount $_A$ by delay device 36, and signal V is similarly delayed in the input to phase detector 32 by an amount $_B$ by delay device 36. Delay devices 36 and 38 delay signals R and V to compensate for propagation delays in the various components comprising phase detector 10.

Phase detector 30 operates by searching for two V pulses in a row before receiving an R pulse. This condition indicates that the phase relationship has exceeded the $2\pi$ range for that detector. When this condition occurs, the "D" input of a flip flop 40 will be in a low state during its clock "C" (from input V), which lowers the logic level on line 42 and prevents the R pulse on line 44 from passing through AND-gate 46 to differential phase detector 34 via line 48. A return to the locked state occurs when there are two R pulses in a row before a V pulse, which causes the "D" input 31 to return to a high state during the clock V, thereby allowing the differential phase detector 34 to be clocked by R. Thus, proportional phase detector 30 and the described associated components prevent passage of R pulses to differential phase detector 48 if the phase relationship is outside the $2\pi$ range of detector 30.

The other one-half of the $4\pi$ lock range L is controlled by a similar circuit comprised of proportional phase detector 32, a flip flop 50, and an AND-gate 56. Thus if two R pulses in a row are detected before a V pulse, flip flop 50 is toggled lowering the logic level on line 52, thereby preventing the passage of V pulses from line 54 through AND-gate 56 to differential phase detector 34 via line 58. Two V pulses in a row will be detected by the proportional phase detector 32, causing flip-flop 50 to toggle to a high level, allowing V pulses to again clock the differential phase detector 34.

Lock monitor signals are provided by flip-flops 41 and 51. Flip-flop 41 has its "C" input coupled to the V signal on line 29 and its output to line 31 through a delay device 43. Similarly, flip-flop 51 is coupled at its "C" input to signal V on line 27 and at its "D" input to line 33 through a delay device 53.

The $Q_R$ and $Q_V$ outputs from differential phase detector 34 are coupled to the inverting (−) and non-inverting (+) inputs 16 and 18, respectively, of integrator 20. Integrator 20 is of conventional design, having resistors 60 and 62 coupled to the inverting and non-inverting inputs 61 and 63, respectively, of a differential operational amplifier 64. Op amp 64 has a feedback path from its output 66 through a capacitor 68 and a resistor 70 to inverting input 61, and a corresponding resistor 69 and capacitor 71 from the non-inverting input 63 to ground. The output 66 of op amp 64 is coupled to low pass filter 22 (FIG. 1) in line 21.

The resulting waveform at line 21 is shown in FIG. 4(c). Below $-2\pi$ the output voltage on lines 21 and 23 (FIG. 1) for controlling VCO 24 is a constant $-V_1$, while above $2\pi$ the control voltage is a constant $+V$. Thus, for any voltage $+V$, an unambiguous phase relationship 418 is provided and a positive lock-in indication is given. In addition, lock-in speed, or slew rate, is increased since the average voltage below $-2\pi$ and above $2\pi$ is greater for the waveform of FIG. 4(c) than for that of FIG. 4(a). Specifically, the average voltage of the repetitive triangular waves of FIG. 4(a) is only one-half that of the constant voltage level of FIG. 4(c). This faster tune characteristic is illustrated in FIG. 5 in that the latched type detector of the present invention provides a more steeply sloped frequency change rate than the non-latched type phase detector of the prior art. Further, the application of the stable voltage from the latched type phase detector of the present invention provides a smoothly varying output frequency $F_o$ as VC0 24 changes from frequency $F_1$ and seeks a new lock condition at frequency $F_2$, as illustrated in FIG. 5. By contrast the sawtooth lock in voltage provided to the VCO by the non-latched phase detector of the prior art produces a varying and abruptly changing rate of frequency change as the VCO changes from $F_1$ to $F_2$, as also illustrated in FIG. 5.

The lock monitor signal corresponding to the error signal waveform of FIG. 4(c) is shown in FIG. 4(d). A positive lock signal 420 corresponding to the $4\pi$ range of the detector is provided by flip-flops 41 and 51, in comparison to the signal of FIG. 4(b) which is cluttered with false indications.

While particular embodiments of the present invention have been shown and described, it is obvious that minor changes and modifications may be made therein without departing from the true scope and spirit of the invention. It is the intention in the appended claims to cover all such changes and modification.

We claim:

1. A phase detector circuit operative in response to first and second input signals having a phase relationship, comprising:
   means for generating a signal indicative of said phase relationship between the first and second input signals; means for detecting when said phase relationship between the first and second input signals is outside a predetermined desired range; and means responsive to the detecting means for decoupling said first and second signals from said generating means when said phase relationship is outside the predetermined desired range.

2. A phase detector circuit operative in response to first and second input signals comprising means for generating a signal indicative of the phase relationship between the first and second input signals as described in claim 1 wherein said first input signal is a reference signal and said second input signal is a signal of variable frequency.

3. A phase detector circuit operative in response to first and second input signals comprising means for generating a signal indicative of the phase relationship between the first and second input signals as described in claim 2 wherein said generating means comprises a differential phase detector.

4. A phase detector circuit operative in response to first and second input signals comprising means for generating a signal indicative of the phase relationship between the first and second input signals as described in claim 3 wherein said detecting means comprises proportional phase detector means.

5. A phase detector circuit operative in response to first and second input signals comprising means for generating a signal indicative of the phase relationship between the first and second input signals as described in claim 4 wherein said proportional phase detector means comprises:
   a first proportional phase detector for detecting a phase relationship between said first and second input signals that is greater in magnitude than said predetermined desired range; and
   a second proportional phase detector for detecting a phase relationship between said first and second input signals that is lesser in magnitude than said predetermined desired range.

6. A phase detector for producing an error signal indicative of the phase relationship between a clock signal R and a variable frequency signal V, comprising:
   a differential phase detector having first and second inputs and providing first and second output signals which constitute an error signal indicative of the phase relationship between said R signal and V signal;
   a first AND gate having its output coupled to the first input of the differential phase detector and the R signal coupled to a first input thereof;
   a second AND gate having its output coupled to the second input of the differential phase detector and the V signal coupled to a first input thereof;
   a first DC flip flop having its output coupled to a second input of the first AND gate and having the C input thereof coupled to said V signal;
   a second DC flip flop having its output coupled to a second input of the second AND gate and having the C input thereof coupled to said R signal;
   a first proportional phase detector having its output coupled to the D input of the first DC flip flop and its inputs coupled to said R and V signals; and
   a second proportional phase detector having its output coupled to the D input of the second D-C flip flop and its inputs coupled to said R and V signals.

7. A phase detector for producing an error signal indicative of the phase relationship between a clock signal R and a variable frequency signal V as described in claim 6 further including an integrator coupled to said first and second outputs of said differential phase detector.

* * * * *